United States Patent
Voigtmann et al.

(10) Patent No.: US 9,566,972 B2
(45) Date of Patent: Feb. 14, 2017

(54) MAIN BRAKE CYLINDER HAVING A DEVICE FOR THE CONTACTLESS MONITORING OF THE POSITION AND MOVEMENT OF A LINEARLY MOVABLE PISTON

(75) Inventors: Thomas Voigtmann, Leipzig (DE); Dirk Simon, Mainhausen (DE); Ingo Knewitz, Neu Anspach (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 228 days.

(21) Appl. No.: 14/378,208

(22) PCT Filed: Jul. 18, 2012

(86) PCT No.: PCT/EP2012/064041
§ 371 (c)(1),
(2), (4) Date: Aug. 12, 2014

(87) PCT Pub. No.: WO2013/120544
PCT Pub. Date: Aug. 22, 2013

(65) Prior Publication Data
US 2015/0033839 A1    Feb. 5, 2015

(30) Foreign Application Priority Data
Feb. 14, 2012  (DE) .................. 10 2012 202 198

(51) Int. Cl.
*G01M 17/00*  (2006.01)
*B60T 17/22*  (2006.01)
(Continued)

(52) U.S. Cl.
CPC .............. *B60T 17/22* (2013.01); *B60T 7/04* (2013.01); *B60T 7/042* (2013.01); *B60T 11/16* (2013.01);
(Continued)

(58) Field of Classification Search
USPC .......................................... 73/121, 128, 129
See application file for complete search history.

(56) References Cited

U.S. PATENT DOCUMENTS 6,110,068 A * 8/2000 Kraska .................. F16D 49/12
188/1.11 L
6,145,633 A * 11/2000 Niederstadt ............ B61H 15/00
188/196 BA
(Continued)

FOREIGN PATENT DOCUMENTS

DE  10 2004 014 808    11/2004
DE  60 2004 012 911    6/2009

OTHER PUBLICATIONS

International Search Report corresponding to application No. PCT/EP2012/064041 dated Dec. 11, 2012.
(Continued)

*Primary Examiner* — Eric S McCall
(74) *Attorney, Agent, or Firm* — RatnerPrestia

(57) ABSTRACT

A main brake cylinder, for use within an electronic braking system for motor vehicles, having a device for contactless monitoring of a position of a piston that can be linearly moved along a piston axis. The device includes a movable element and a sensor unit. The sensor unit is fixedly arranged on a housing of the main brake cylinder and is connected to an electronic evaluation unit for processing signals from the device. According to the invention, in order to further increase function precision, to lower manufacturing expenditure, number of components, and costs, to reduce overall length, and to improve calibration options, a magnetic field is realized such as to be emittable from the sensor unit, and a yoke is dedicated to the piston for position-dependently changing the magnetic field such that the change can be detected by the sensor unit.

23 Claims, 7 Drawing Sheets

(51) Int. Cl.
*B60T 7/04* (2006.01)
*B60T 11/16* (2006.01)
*G01D 5/14* (2006.01)
*B60T 13/12* (2006.01)
*B60T 13/66* (2006.01)
*G01B 7/00* (2006.01)
*H03K 17/95* (2006.01)
*H03K 17/97* (2006.01)

(52) U.S. Cl.
CPC ............... *B60T 13/12* (2013.01); *B60T 13/66* (2013.01); *G01B 7/003* (2013.01); *G01D 5/147* (2013.01); *H03K 17/9517* (2013.01); *H03K 17/97* (2013.01)

(56) References Cited

U.S. PATENT DOCUMENTS

| | | | | |
|---|---|---|---|---|
| 6,176,352 B1* | 1/2001 | Maron | ................ | B60T 13/741 188/1.11 E |
| 7,640,742 B2* | 1/2010 | Tandler | ................ | B60T 17/225 60/534 |
| 8,392,085 B2* | 3/2013 | Schonlau | ................. | 303/122.03 |
| 2002/0157394 A1* | 10/2002 | Zehnder, II | ............. | B60T 7/042 60/534 |
| 2003/0205931 A1* | 11/2003 | Muller | ................... | B60Q 1/441 303/20 |
| 2004/0020201 A1* | 2/2004 | Feigel | .................... | B60T 7/042 60/534 |
| 2004/0164611 A1 | 8/2004 | Masson et al. | | |
| 2007/0182403 A1* | 8/2007 | von Hayn | ............... | B60T 7/042 324/207.24 |
| 2009/0210124 A1* | 8/2009 | Schonlau | .................. | B60T 8/38 701/70 |
| 2011/0074209 A1* | 3/2011 | Ueno | .................... | B60T 13/745 303/20 |
| 2013/0086900 A1* | 4/2013 | Kim | ....................... | B60T 11/16 60/533 |

OTHER PUBLICATIONS

German Search Report corresponding to application No. DE 10 2012 212 525.6, dated Feb. 11, 2014.

* cited by examiner

MAIN BRAKE CYLINDER HAVING A DEVICE FOR THE CONTACTLESS MONITORING OF THE POSITION AND MOVEMENT OF A LINEARLY MOVABLE PISTON

CROSS REFERENCE TO RELATED APPLICATION

This application is the U.S. National Phase Application of PCT International Application No. PCT/EP2012/064041, filed Jul. 18, 2012, which claims priority to German Patent Application No. 10 2012 202 198.1. filed Feb. 14, 2012, the contents of such applications being incorporated by reference herein.

FIELD OF THE INVENTION

The invention relates to a brake master cylinder insert.

BACKGROUND OF THE INVENTION

Brake master cylinders having a contactless detection means are known in principle.

For example, DE 10 2004 014 808 A1, which is incorporated by reference, describes a brake master cylinder, a magnet being provided as transmitter element such that it is arranged between two pistons in a bore of the housing and can be displaced relative to at least one of the pistons by means of spring means. In order to guide the magnet, a piston has a journal-like piston section, on which a carrier for the magnet is arranged in a resiliently prestressed manner. However, an arrangement of this type of a magnet requires a relatively complicated construction with additional components and conflicts with a regular desire for a reduction of the dimensions.

SUMMARY OF THE INVENTION

An aspect of the present invention further increases the functional precision, to decrease the manufacturing outlay, number of components and costs with a reduced overall length, and to improve calibration options.

It is to be noted here that the construction and method of operation of conventional master cylinders and their role in a brake system have been described sufficiently in the literature (see, for example, Bremsen-Handbuch [Brake Manual], ISBN-3-528-03952); merely the features and functions which are associated with the present invention will therefore be described in the following text.

Advantages

An apparatus for contactlessly monitoring a piston of a brake master cylinder according to the invention is proposed, in which a sensor unit which is arranged in a stationary manner on the housing of the brake master cylinder emits a magnetic field in the direction of the piston, and the piston is assigned a yoke which closes a magnetic circuit and influences and changes or distorts the magnetic field which is generated in the sensor unit in such a way that this change can be detected by the sensor unit. An instantaneous position and, as a result, also a movement of the yoke can be detected particularly simply and exactly by the sensor unit as a result.

The required magnetic field can be generated particularly simply by way of a permanent magnet within the sensor unit. Here, the permanent magnet can preferably be capable of being produced from an inexpensive plastic-bonded hard ferrite and without rare earths using the injection molding process. As a result, the permanent magnet can advantageously be produced comparatively simply, inexpensively and in virtually any desired variety of shapes.

The sensor unit can be provided particularly simply such that it is arranged on the outside of the housing of the brake master cylinder, for example in a suitable blind bore or a different type of recess or fastening device, which guarantees simple access, a wide variety of design and connection options and uncomplicated replaceability in the case of damage.

The apparatus according to an aspect of the invention is advantageously not dependent on a movable magnet, with the result that the brake master cylinder can be of particularly simple and compact design. A risk of the accumulation of magnetic particles within the brake master cylinder is also reduced considerably and, as a result, a positive effect can be achieved on the service life of, for example, sealing elements. Furthermore, considerably lower field strengths are required for reliable sensing; as a result, a larger air gap or spacing between the yoke and sensor unit is made possible, and a lower measuring deviation can be achieved. As a result of the use of a more powerful magnetic field, particularly large air gaps or measuring ranges can be realized with a use of material which is still relatively low in comparison with the prior art.

It is particularly advantageous if the required magnetic field is generated by way of a magnet element which is arranged in the sensor unit. The magnet element can particularly efficiently be configured in such a way that it is of single-piece design, has a main body and at least three projections, the projections extending from the main body largely in the direction of the piston axis and, at their ends which face the piston axis, forming equivalent magnetic poles, the magnetic fields of which repel one another.

It is particularly advantageous if at least one of the projections is configured so as to be shorter than at least two further projections. By way of at least three above-described magnetic poles of this type, a spatial section is also delimited, in which there is a local minimum of a magnetic flux density where B=0 mT or B≈0 mT.

At least one magneto-sensitive element can advantageously be arranged in the spatial section between the magnetic poles in such a way that the above-described local minimum of the magnetic flux density prevails within the magneto-sensitive element. As a result, for example, the magneto-sensitive element can react in a particularly sensitive manner to changes of the magnetic flux density.

Furthermore, a particularly simple, robust and inexpensive construction of the sensor unit and the assembly of the apparatus become possible. Here, comparatively inexpensive materials such as, in particular, plastic-bonded hard ferrite and efficient manufacturing processes such as for example injection molding processes can be used to manufacture the magnet element, in order to achieve a magnetic field strength and magnetic flux density which are sufficient for reliable measurement. Rare earths which are comparatively more expensive can be dispensed with.

The piston, the position and movement of which are monitored, can advantageously be configured from a nonmagnetizable material, in particular plastic material. As a result, for example, significant advantages can be achieved in terms of costs, weight and design options. It goes without saying, however, that the piston can also be manufactured as a metal piston from a material which is non-magnetizable or substantially non-magnetizable, or can be manufactured using a mixed design.

Furthermore, the above-described apparatus makes an advantageous weight-saving and cost-reducing design possible of the brake master cylinder from non-magnetizable materials, for example an aluminum material or a plastic material.

In one advantageous development of the invention, the yoke is provided such that it is arranged directly on the piston, an indirect arrangement with further intermediate elements also being possible. Here, the yoke can be provided such that it is supported or fixed both directly on the piston and on an additional shaped-out formation of the piston, for example a pinion.

It is particularly advantageous, however, if the piston has a recess for receiving the yoke, into which recess the yoke can be capable of being inserted, for example a groove, or which is directly produced immediately around the yoke during manufacturing of the piston, for example in the case of encapsulation of the yoke by piston material.

In one particularly advantageous embodiment of the invention, the yoke can be configured so as to be annular and therefore insensitive to a radial rotation of a piston.

By way of one or more above-described combinations of features, a type of module system can advantageously be realized and, as a result, a relatively great scope of possible embodiments can be covered by way of comparatively few standard elements.

In addition, this makes particularly inexpensive manufacturing capability and simple connectability of the yoke and piston possible. Thus, for example, the yoke can be introduced into a circumferential groove which is arranged on the inside or outside of the piston, can be screwed to the piston, adhesively bonded, plugged, secured by way of a circlip or fastened in some other way on the piston. Furthermore, fastening of the yoke on an additional element which is coupled to the piston and can be moved synchronously with the latter would be conceivable.

In one particularly advantageous development of the invention, the yoke can be designed on its outer circumference to be covered completely or partially by the piston material in such a way that advantageously a disruption-free smooth surface of the outer wall of the piston will be able to be realized without disruptive elements, which, for example, considerably reduces risk of an accumulation of dirt particles in the region of the yoke and makes it possible for a sealing element to move over it without the disadvantages of possible sealing lip damage.

It goes without saying, however, that further forms of the yoke and also further materials and attachment types can also be realized, without departing from the invention; for example, it is conceivable as a segment element, a cylindrical or polygonal insert element, etc.

In one advantageous embodiment, the yoke can be produced from a simple comparatively inexpensive steel material, in particular machining steel, and can therefore be manufactured considerably less expensively than, for example, a transmitter element made from a magnetic material. However, in principle any desired materials which can conduct a magnetic field are advantageously suitable for manufacturing the yoke.

By way of a displacement of the yoke in the magnetic field and along a displacement axis of the piston, the magnetic field is changed or distorted, in particular, in a radial direction which is substantially perpendicular with respect to the displacement axis of the piston. This change can advantageously be capable of being detected particularly exactly and reliably by way of the stationary sensor unit, in particular as a local change in a magnetic flux density.

In order to detect the change of the magnetic field, the sensor unit has one or more magneto-sensitive elements.

A relatively inexpensive Hall element can advantageously be used as a magneto-sensitive element, although of course another type can also be used. A Hall element in principle has a solid body, through which current flows, and can usually be configured as a thin semiconductor wafer or strip. If said solid body is moved into a magnetic field which is arranged perpendicularly with respect to the current flow, the electrons in the solid body are deflected by way of the Lorentz force perpendicularly with respect to the magnetic field. As a result of this displacement of the charge, a voltage is generated which is proportional to the product of the magnetic field strength and the current, what is known as the Hall voltage. The level of the voltage provides information about the strength of the magnetic field or its change. This effect is ultimately used in order to detect the position and movements of bodies which can influence the magnetic field. The direction of the Lorentz force and of the current flow form a plane which can be called the sensitive plane of a Hall sensor. A Hall sensor is usually arranged in such a way that the sensitive plane is oriented as far as possible perpendicularly with respect to the orientation of a magnetic field to be measured. Other magneto-sensitive elements or sensors usually likewise have a sensitive plane which is to be oriented perpendicularly with respect to the magnetic field, in order to achieve an optimum measuring effect. In one advantageous development of the invention, the magneto-sensitive element can be arranged in the sensor unit and relative to the magnetic field in such a way that there is a local minimum of the flux density of a magnetic field with ideally 0 mT in the immediate vicinity of the magneto-sensitive element. As a result, a particularly robust and accurate measured result can be achieved because, for example, even small distortions of the magnetic field by way of the yoke can cause a considerable change in a flux density within the magneto-sensitive element. As a result of particularly high efficiency of an arrangement of this type, in addition, greater air gaps can advantageously be realized and/or less expensive magneto-sensitive elements with lower sensitivity can be used than required for a comparable field of use from the prior art. Thus, movements of the yoke below 1 mm distance can advantageously be unambiguously registered without doubt and can therefore be defined as a switching point. A distance of this type, in relation to most known master cylinders, is smaller than a closing travel of a piston, that is to say a travel which the piston covers until a pressure equalization connection between a pressure chamber and a pressure medium container is interrupted and a build-up of pressure occurs for the first time in a brake circuit. As a result, for example, a particularly important time advantage can be gained in the case of a critical brake maneuver, in order, for example, to initiate a necessary control operation or further action.

Both analog Hall elements or other elements, for example for the continuous detection of travels or distances, and digital Hall sensors or other elements in the sense of presence indicators can advantageously be used within the invention, also in combination with one another. Sensor units can therefore be provided for a wide variety of areas of use and requirements, and also singly or multiply redundant sensor units for increased reliability or more precise measured results.

It is likewise possible to provide the sensitive planes of the magneto-sensitive elements such that they can be oriented both parallel to and transversely with respect to a movement axis of the piston or the yoke, in order to take into account, for example, defined spatial conditions or requirements of the shape of a sensor unit or else further causes and in the process to continue to ensure a reliable measured result.

In one development of the invention, the magneto-sensitive element can be assigned an electronic signal processing apparatus. By way of a signal processing apparatus of this type, for example, primary electrical values which can be detected on the magneto-sensitive element can be converted into secondary electrical signals, in order to subsequently forward said secondary electrical signals to an evaluation unit. In particular, the electronic signal processing apparatus can be provided such that it is integrated into the sensor unit; in this way, a compact sensor unit which can be replaced simply and has particularly low electrical losses can be realized. Furthermore, a risk as a result of external disruption sources, for example radio emission with regard to electromagnetic compatibility, can be reduced.

The transmitter element can particularly advantageously be arranged in a region of a brake master cylinder, which region is loaded as little as possible by way of pressure forces, with the result that the sensor unit can be provided such that it is attached particularly closely to the yoke, without promoting possible damage of a housing of the brake master cylinder as a result of a thin wall between the sensor unit on the outside and the yoke on the inside.

The apparatus for contactlessly monitoring the position and movement of a piston which can be moved linearly of a brake master cylinder according to the invention can advantageously register the position and movement by virtue of the fact that the yoke is displaced in the axial direction in a spatial region above the magneto-sensitive element in the case of a piston movement and in the process influences or distorts a magnetic field which is generated by a permanent magnet and penetrates the magneto-sensitive element. Influencing of this type of the magnetic field causes a local change in a magnetic flux density within the magneto-sensitive element. The change in the flux density within the magneto-sensitive element causes a change in an electrical value which can be detected, for example a voltage. This change can subsequently be evaluated by the evaluation unit and, for example, a distance of the yoke from the magneto-sensitive element can be calculated therefrom or merely the presence of the transmitter element in a spatial section which can be sensed by the sensor unit can be detected. Here, no moving magnet elements are advantageously required; virtually every element which distorts a magnetic field becomes detectable. For example, a yoke might be dispensed with completely as an individual element and, instead, a suitable detectable structural element might be provided directly on a piston made from a suitable material, for example a circumferential flange or further shaped elements. An arrangement of this type can advantageously be designed in such a way that a higher value of the flux density is registered in a starting position of the piston and a lower value is registered after a piston movement in the actuation direction, a drop in the flux density between the two points running virtually linearly. As a result, a respective position of the piston can be calculated particularly simply, precisely and reliably, and an influence of tolerances can be detected and corrected comparatively simply.

Every technical product is subject to tolerances. Tolerances of this type, for example manufacturing tolerances or positional tolerances but also a temperature of the magneto-sensitive element or other system components, can influence and falsify a measured result which is planned during designing. A starting position of a piston in a brake master cylinder also does not always have to be exactly the same position because, for example, frictional forces on sealing elements and variations in stiffness of restoring springs can influence said position.

It therefore appears appropriate and advantageous to perform an electronic calibration of an apparatus for contactlessly monitoring the position and movement of a piston which can be moved linearly, either once during commissioning or regularly, in order to assign an actual spatial position of the relevant elements with respect to one another, in particular an axial spacing, to the actually measured values of the flux density, for example an actual starting position of a piston in the brake master cylinder in a non-actuated state to an instantaneous value of a magnetic flux density in the magneto-sensitive element. This value can then, for example, be defined every time after an ignition operation in a motor vehicle and therefore in the case of each renewed activation of the apparatus or in the case of each renewed actuation, and can be assigned to a starting position. However, a measure of this type can likewise be dispensed with in the case of certain requirements, or tolerance equalization can be compensated for in another way or at a different interval.

It can likewise advantageously be provided to consider an influence of the temperature on one or more system components or electrical signals and to compensate electrically for temperature-induced effects.

DESCRIPTION OF THE FIGURES

Further details, features, advantages and possible uses of the invention are apparent from subclaims together with the description using the drawings. Identical elements and elements with identical functionality are provided if possible with identical designations. In the following:

DETAILED DESCRIPTION OF THE PREFERRED EMBODIMENT

FIG. 1

Figure 1:
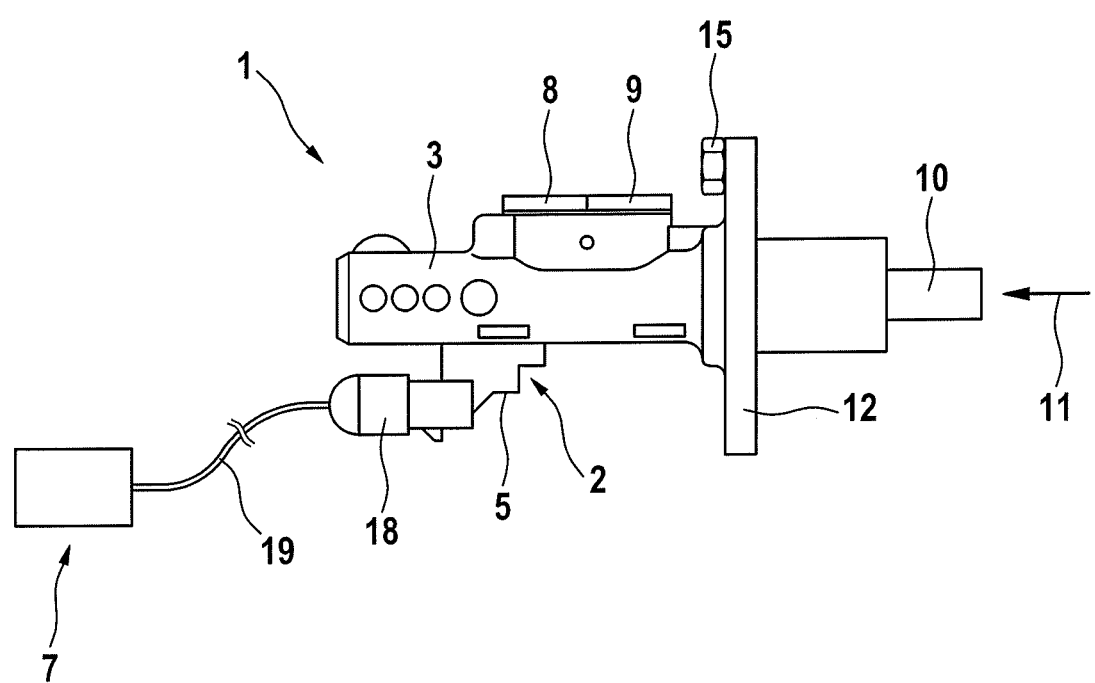
FIG. 1: shows an illustration of a brake master cylinder, equipped with an apparatus for contactlessly monitoring the position and movement of a piston which can be moved linearly.

FIG. 1 shows one embodiment of a brake master cylinder 1 according to an aspect of the invention, comprising an apparatus 2 for contactlessly monitoring the position and movement of a piston 17 (not shown) which can be moved linearly. A brake master cylinder 1 for generating pressure in a hydraulic brake system which is connected thereto but is not shown having a piston/spring arrangement which is arranged within a housing 3 is connected via hydraulic connectors 8, 9 to a pressure medium storage container (not shown) and has a push rod 10 for absorbing and transmitting an actuating force 11. Here, the actuating force 11 can be introduced into the push rod 10 by way of a wide variety of apparatuses which can generate force, which boost force or which divert force, for example by way of a pneumatic or hydraulic brake booster, an actuator or another comparable assembly, or directly by way of a brake actuating device, it being possible for the introduction of force to be initiated by a person or to be externally controlled by way of an automated device.

Furthermore, the brake master cylinder 1 which is shown here has a flange 12 which is configured on the housing 3 for fastening by means of one or more connecting elements 15 to an assembly for introducing the actuating force 11 or to a holding apparatus. A reversibly releasable screw or a threaded bolt/nut combination is usually used as connecting element 15.

Furthermore, the apparatus 2 is connected to an electronic evaluation unit 7 via a disconnectable electrical connection 18, for example a plug, and an electrical line 19, the line 26 being suitable both to supply energy to the apparatus 2 and to transmit detected electrical values which have not been converted. For example, a suitable control unit can be provided as evaluation unit 7 in a motor vehicle, but it is likewise possible to provide a separate electronic component which is integrated into a sensor unit 5 and forwards the detected electrical values in converted form to a further electronic assembly. The electrical values which are detected by way of the apparatus 2 can then be used, for example, to control electronic control operations in a brake system, to control visual and acoustic warning apparatuses, to interpret brake requests which are initiated by a person, and for further purposes.

FIG. 2

Figure 2:
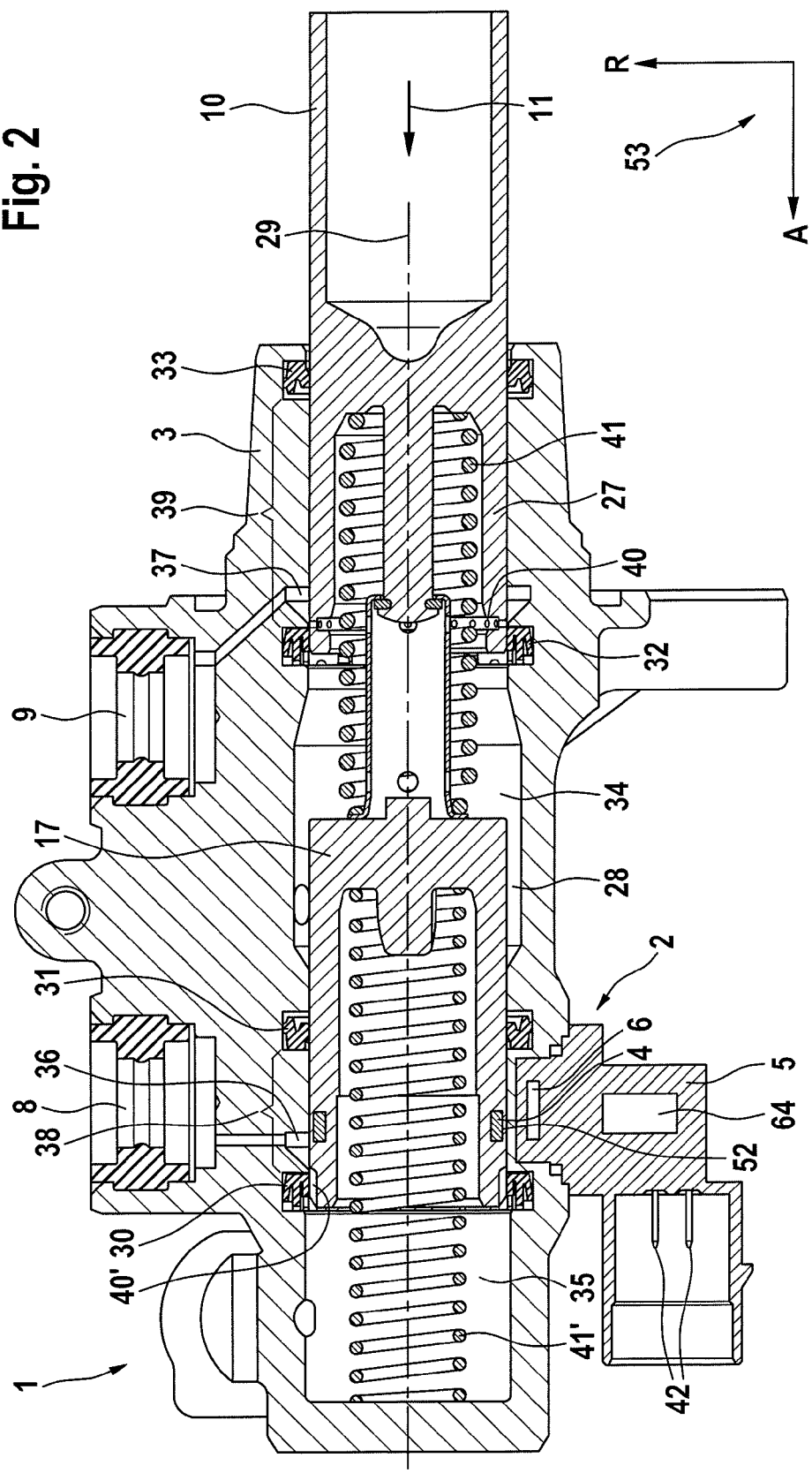
FIG. 2: shows a longitudinal section of one embodiment of a brake master cylinder according to the invention.

FIG. 2 shows a sectional illustration of one embodiment of a brake master cylinder 1 according to the invention having an apparatus 2 for contactlessly monitoring the position and movement of a piston 17 which can be moved linearly. Furthermore, a coordinate system 53 with its axes which are denoted as "R" for "radial" and "A" for "axial" serves to explain directional terms which are used henceforth.

The brake master cylinder 1 which is shown here is a tandem master cylinder of what is known as the plunger type. Said cylinder comprises a first piston 27 which is configured at one end of the push rod 10 and a separate second piston 17 for building up the brake pressure, the brake pressure being built up during a movement of the pistons along a piston axis 29 in the direction of the actuating force 11. The two pistons are arranged one behind another such that they can be displaced linearly in a cavity 28 within the housing 3, which cavity 28 is of largely cylindrical configuration and is stepped multiple times. Four elastomeric direction-dependent sealing elements 30 to 33 are let in a stationary manner into the wall of the cavity 28, sealing lips of the sealing elements 30 to 33 sliding on cylindrical outer walls of the piston 17, 27. Here, the sealing elements 30, 32 and 33 seal counter to the direction of the actuating force 11 and the sealing element 31 seals in the direction of the actuating force 11, and they can be flowed over in each case in the opposite direction. As a result, a first pressure space 34 and a second pressure space 35 are formed which are connected via brake lines (not shown) to in each case one pair of wheel brakes (likewise not shown) and thus configure two separate brake circuits.

A working pressure is built up in the two pressure spaces 34, 35 during the piston movement of the pistons 17, 27 in the direction of the actuating force 11. The hydraulic connectors 8, 9 to a pressure medium storage container (not shown) which is under ambient atmospheric pressure are for their part connected via return bores 36, 37 to the cavity 28 and, as a result, permit a transfer of pressure medium, the return bores 36, 37 opening in each case into the cavity 28 in a region between the sealing elements 30 and 31 and 32 and 33, respectively. As a result, a considerably lower pressure compared with a pressure in the pressure spaces 34, 35 prevails in the region between the sealing elements 30 and 31 and 32 and 33, respectively, even in the case of an actuated brake, and low pressure regions 38 and 39 are formed. In the ideal case, an ambient atmospheric pressure prevails there.

In a piston position which corresponds to a non-actuated brake, a direct hydraulic connection exists in each case between the return bores 36, 37 and the pressure spaces 34, 35, which direct hydraulic connection is realized by means of concentrically arranged bores 40 or notches 40' at the pressure space-side end of a respective piston 17, 27. An ambient atmospheric pressure prevails in the two pressure spaces 34, 35. After a defined displacement travel of the pistons 17, 27 in the direction of the actuating force 11, said connections are disconnected by way of the sealing element 30 and 32, respectively, and are therefore closed, and a build-up of pressure begins in the pressure spaces 34, 35. The above-described displacement travel is also called closing travel.

Finally, restoring springs 41 and 41' respectively serve to restore the pistons 17, 27 after a brake actuation. Moreover, a directional dependence of the sealing elements 30 to 33 makes general pressure equalization between the two pressure spaces 34, 35 and therefore also in the respective brake circuits which are connected to the pressure spaces 34, 35 possible in a non-actuated operating state.

The exemplary embodiment shows the second piston 17 made from a plastic material, a recess 52 being provided in the piston 17 and a yoke 4 in the form of a ring which is manufactured from a machining steel being arranged in the recess 52. In the exemplary embodiment which is shown, the yoke 4 is provided such that it is encapsulated by the material of the piston and is enclosed on all sides by flanks of the recess 52.

However, further fastening types are also possible, without departing from the invention; for instance, the yoke 4 can be encapsulated, for example, only partially or the recess 52 can be provided as a circumferential groove which is arranged on the inside or outside of the piston 17, into which groove the yoke 4 is introduced. Furthermore, the yoke 4 can be screwed to the piston, adhesively bonded, plugged, secured by way of a circlip or fastened in a different way 17. Furthermore, fastening of the yoke 4 on an additional element which is coupled to the piston 17 or 27 and can be moved synchronously with the latter would be conceivable. Further designs of the yoke, for example as a segment, a cylindrical or polygonal insert element, etc., are also likewise conceivable. Furthermore, further materials which can conduct a magnetic field are suitable for manufacturing the yoke 4. Other substantially non-magnetizable materials, for example aluminum, can likewise be realized for the piston 17 within the invention.

The yoke 4 is arranged in the interior of the housing 3 largely opposite a sensor unit 5 which is arranged in a stationary manner on the outside of the housing 3. The sensor unit 5 comprises for its part at least one magneto-sensitive element 6, for example a Hall element, and a permanent magnet (not shown) for generating a magnetic field which can be distorted by way of the yoke 4 and the distortion of which causes a change in an electrical value in the magneto-sensitive element and can therefore be detected by the sensor unit 5, can be transmitted as an electrical signal to an electronic evaluation unit 7 (not shown), and can be interpreted by way of the evaluation unit 7 as a positional indication of the yoke 4. The yoke 4 therefore closes a magnetic circuit which is present in the apparatus 2. Furthermore, an electronic signal processing apparatus 64 can be provided in the sensor unit 5. A signal processing apparatus 64 of this type can be used, for example, for processing primary electrical values which can be detected at the magneto-sensitive element 6 into secondary electrical signals, the secondary electrical signals being forwarded to the evaluation unit 7.

In further embodiments and developments of the invention, a plurality of magneto-sensitive elements 6 can also be provided such that they are arranged next to one another in the sensor unit 5 and/or are oriented in spatially different manners.

Furthermore, the sensor unit 5 has a plurality of contact elements 42 for attaching to an electrical supply device (not shown) for supplying the magneto-sensitive element 6 and to an abovementioned electronic evaluation unit 7 for evaluating electrical signals which are generated by way of the magneto-sensitive element 6.

Supply devices are usually provided in a combined manner with an electronic evaluation unit in an assembly, for example a control unit, but this can also be achieved in a different way, depending on the specific use requirements and the type of magneto-sensitive element 4, or a supply device can even be dispensed with, without departing from the invention.

It is noteworthy that the yoke 4 is arranged within the low pressure region 38 which is loaded to a small extent by way of pressure forces, which makes it possible without risk to realize a particularly thin wall of the housing 3 between the cavity 28 and the sensor unit 5 and therefore a particularly small spacing between the yoke 4 and the magneto-sensitive element 6. This has great relevancy for a resulting signal strength and range of reliable position and movement detection of the yoke 4.

The above-described structural elements can likewise exist in modified embodiments, without departing from the invention; for instance, central valve brake master cylinders or further brake master cylinders which are equipped with pistons and/or push rods can also be assigned, for example, to one embodiment of an apparatus 2.

FIG. 3

Figure 3:
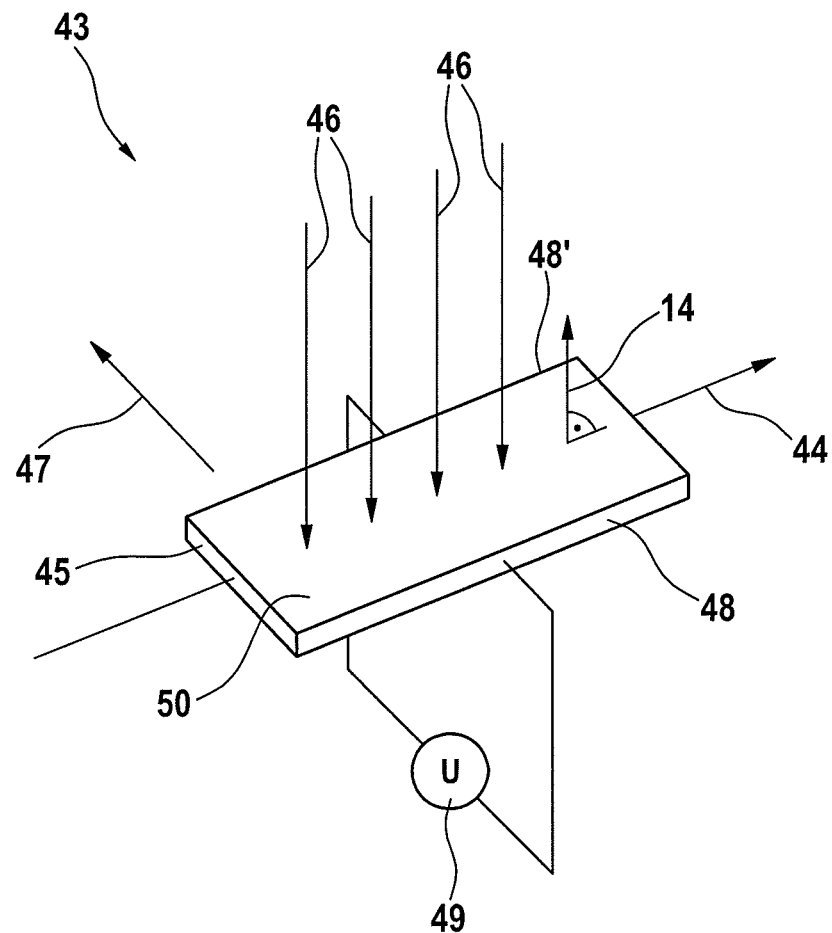
FIG. 3: shows a simplified outline sketch of a Hall element.

FIG. 3 shows a Hall element 43 in a greatly simplified manner in order to clarify its method of operation. A Hall sensor which builds on a Hall element 43 of this type can also comprise a plurality of Hall elements 43 of this type.

A Hall element 43 in principle has a solid body 45, through which current flows, and which is usually configured as a thin semiconductor wafer or strip. If the solid body 45 is moved into a magnetic field 46 which is shown by symbols and is arranged perpendicularly with respect to the current flow 44, electrons in the solid body 45 are deflected perpendicularly with respect to the magnetic field 46 by way of a Lorentz force 47, and a charge transfer occurs which leads to an electric potential difference on opposite sides 48, 48' of the solid body 45. Said potential difference can be detected as a voltage 49 "U", what is known as a Hall voltage, said voltage being proportional to the product of the magnetic field strength and the current. The level of the voltage 49 supplies information about the strength of the magnetic field 46 or its change. This effect can be used to detect the position and movements of bodies which influence the magnetic field 46, for example can distort its direction or can change its strength. The direction of the Lorentz force 47 and of the current flow 44 form a plane which can be called the sensitive plane 50. In order to achieve an optimum measuring effect, a Hall element 43 is usually arranged in such a way that the sensitive plane 50 is oriented as far as possible perpendicularly with respect to the orientation of a magnetic field 46 which is to be measured, or a normal 14 of a sensitive plane 50 is oriented parallel to the magnetic field 46. Other magneto-sensitive elements or sensors usually likewise have a sensitive plane which should be oriented perpendicularly with respect to the magnetic field, in order to achieve optimum signal strengths.

FIG. 4

FIG. 4a shows an outline sketch of an interaction of a yoke 4 with a magneto-sensitive element 6 within the apparatus 2 in two different spatial orientations of the magneto-sensitive element 4 with a yoke position (4a, 4c) which is displaced axially by a spacing 54 and a central yoke position (4b, 4d), all the elements being shown in a greatly simplified manner and in a sectional illustration.

In order to achieve robust measured results, a flux density minimum is desirable in the immediate vicinity of the magneto-sensitive element 6. In order to achieve this, the magneto-sensitive element 6 is provided such that it is arranged in a magnet element 55. The magnet element 55 is configured in one piece, has a main body 56 and projections 57, 58 and 59 which extend from the main body 56 in the direction of the piston axis 29. Here, the middle projection 58 is of shorter configuration than the equally long projections 57 and 59 which flank it. At their ends which face the piston axis 29, the projections 57, 58 and 59 have identically polarized magnetic poles 60, 61 and 62. As a result, magnetic fields 16 and 63 which are shown symbolically are formed around the magneto-sensitive element 6. Here, the magnetic field 16 is repelled by the magnetic field 63 and is pressed in the direction of the piston axis 29 as a result. As can be seen from FIG. 4a, the magnetic field 16 extends largely above the magneto-sensitive element 6, to be precise in such a way that a spatial section which encloses the magneto-sensitive element 6 at least partially can be localized, in which a value of a magnetic flux density is equal to or virtually equal to 0 mT. A spatial section of this type will henceforth be called the working region 26 and is responsible, in particular for the fact that even very small changes in the flux density can be registered effectively and reliably by the magneto-sensitive element 6.

In the case of a piston movement along a movement axis 51 parallel to the piston axis 29, the yoke 4 is displaced by an axial spacing 54 transversely with respect to the magneto-sensitive element 6. It can be seen from FIG. 4b that the magnetic field 16 is distorted here by the yoke 4 and is displaced into the working region 26. This influencing of the magnetic field 16 causes a local change in a magnetic flux density within the magneto-sensitive element 6. In a magneto-sensitive element 6 which is configured as a Hall element, said flux density change generates a change in an electrical voltage 49 "U" which can be tapped off and is shown in FIG. 3. By way of an evaluation of the value of the electrical voltage 49, starting from a value which is detected in a first position of the yoke 4, an extent of a displacement of the yoke 4 with respect to its first position and therefore, for example, a new instantaneous position of a piston which is connected to the yoke 4 can be calculated.

Figure 4:
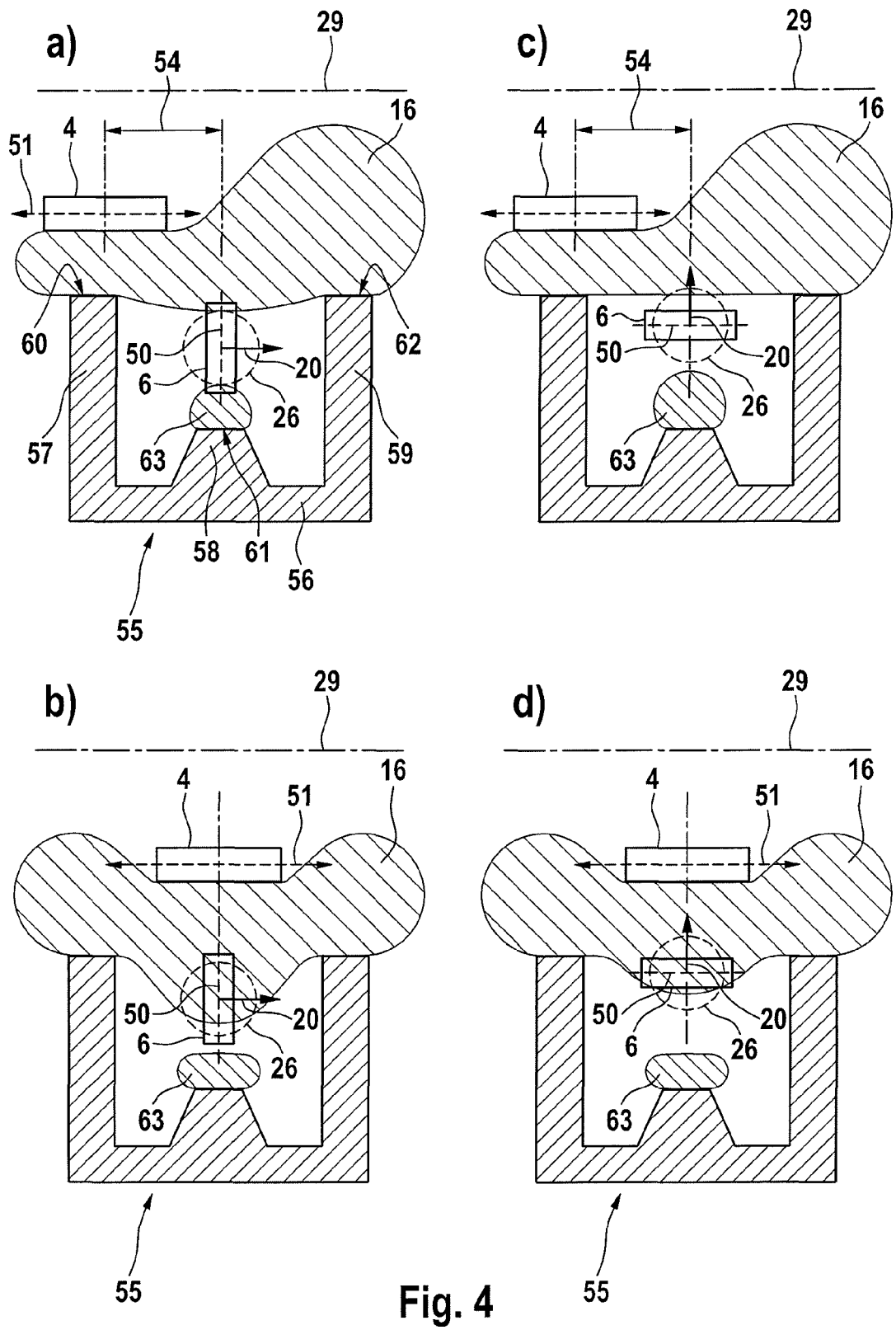
FIGS. 4a-4d: show an outline sketch of an interaction of a yoke with a magneto-sensitive element and a magnet element with two different arrangements and respective relative positions.

In FIGS. 4a and 4b, the magneto-sensitive element 6 is arranged in such a way that a normal 20 of its sensitive plane 50 lies parallel to the movement axis 51. FIGS. 4c and 4d show a further suitable embodiment, in which the normal 20 of the sensitive plane 50 of the magneto-sensitive element 6 is oriented perpendicularly with respect to the movement axis 51. Furthermore, it can be seen from FIG. 4 that the two arrangements which are shown function identically in principle. Here, a selection of a suitable embodiment or an orientation of the magneto-sensitive element 6 relative to the movement axis 51 for a specific use can be influenced by respective specifications such as installation space, a desired monitoring region and measuring accuracy, respective specific properties of a magneto-sensitive element 4 and the yoke 4, and further factors.

Furthermore, a plurality of magneto-sensitive elements 6 can be arranged next to one another in a sensor unit 5 in further developments of the invention. By way of an arrangement of this type of two identical magneto-sensitive elements, for example, redundancy and, as a result, increased resilience and reliability of the measured results can be achieved. However, one digital and one analog magneto-sensitive element can likewise be provided next to one another, in order to expand a functional scope of the apparatus 2, in order to realize an inexpensive back-up solution with a limited functional scope, or in order to achieve another desired result.

FIG. 5

Figure 5:
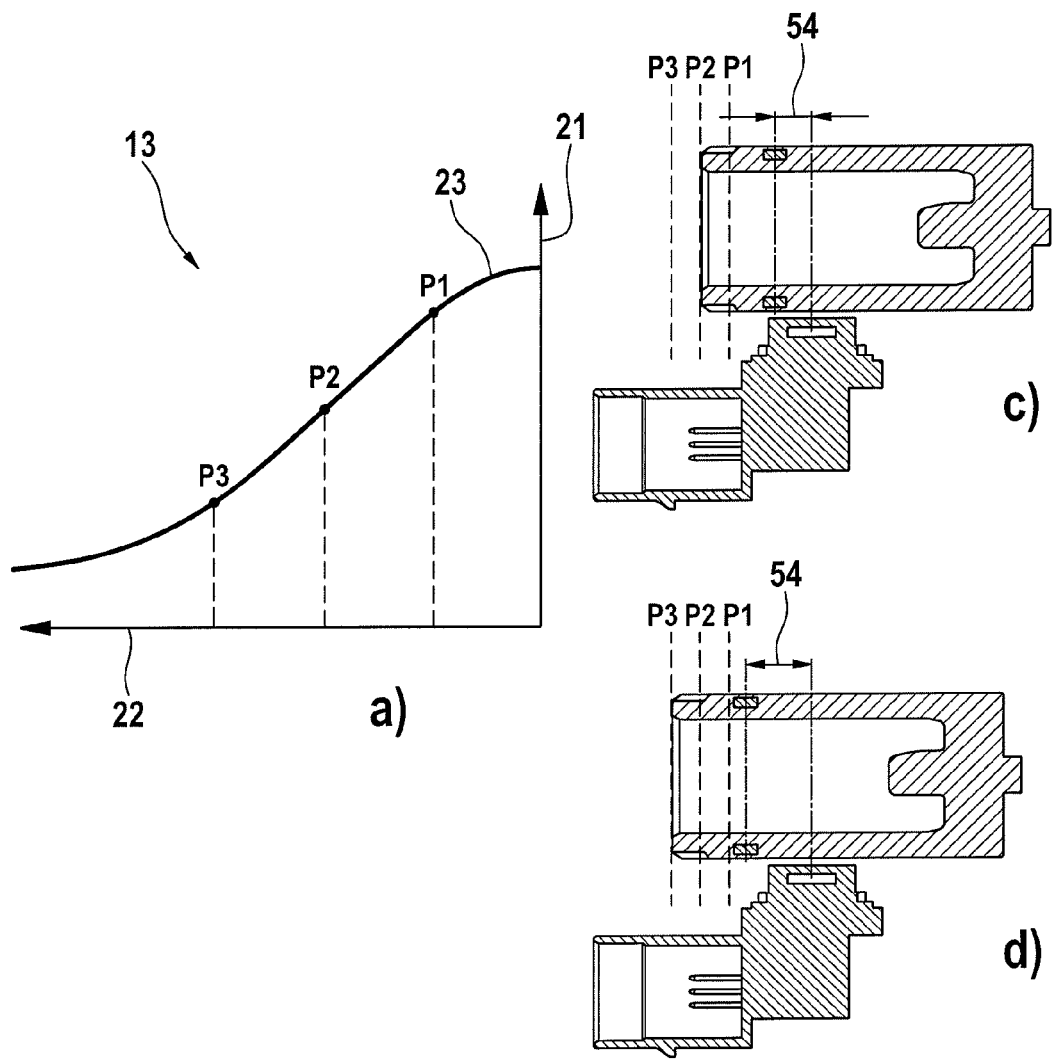
FIGS. 5a-5d: show a diagram of a distance-dependent magnetic flux density change for three different piston positions which can be registered by a sensor unit.

A diagram 13 which is shown in FIG. 5a shows a principle profile of the magnetic flux density which is registered by way of the magneto-sensitive element 6 over a travel of the piston 17 or the yoke 4 by way of a curve 23 in a manner which is exemplary and not true to scale. Here, an intensity of the flux density is plotted on a perpendicular axis 21 of the diagram, and a travel or an extent of displacement of the yoke 4 is plotted on a horizontal axis 22. Here, points P1, P2 and P3 correspond in principle to the different positions or axial spacings 54 of the piston 17 relative to the sensor unit 5, as indicated in FIGS. 5b, 5c and 5d. It can be seen that a virtually linear course of the curve 23 exists between points P1 and P3. As a result, a position of the yoke 4 can be interpreted particularly simply and reliably, fault detection is also simplified considerably, and the influence of tolerances is reduced.

Position P1 can be provided, for example, as a starting position of the piston 17 in the non-actuated state of a brake master cylinder, in which the piston is arranged. With reference to FIG. 4, it becomes clear that, in said piston position (5b), the yoke 4 is positioned virtually directly above the magneto-sensitive element 6 and a virtually maximum possible flux density can be registered (cf. FIG. 4d). During a displacement of the piston 17 into position P2 (5c), the yoke 4 is displaced relative to the magneto-sensitive element 6, the magnetic field is distorted partially, the working region 26 is now penetrated to a lesser extent than at position P1, and a value of the flux density which can be registered is reduced. This development is continued at position P3 of the piston 17, with the result that virtually a minimum possible value of the flux density now becomes capable of being registered in the working region 26 (cf. FIG. 4c).

FIG. 6

Figure 6:
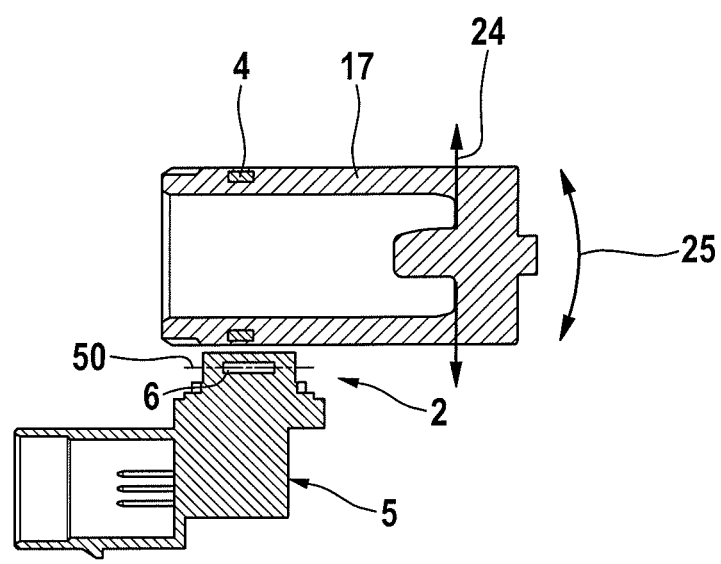
FIG. 6 shows a sketch to illustrate relevant positional tolerances.

Every technical product is subject to tolerances. A profile as shown in diagram 13 represents an ideal case. It is shown in principle in FIG. 6 that, for example, a relative spacing between the sensor unit 5 and the piston 17 varies in the transverse direction 24, a relative angularity 25 of the movement axis 51 with respect to the sensitive plane 50 differs from a structurally fixed stipulation, and also further shape and positional tolerances which are not shown explicitly here occur.

This and further tolerances can influence a relative spacing of the yoke 4 with respect to the magneto-sensitive element 6 and therefore the measured result in an undesired manner. It therefore appears appropriate to perform an electronic calibration of the apparatus 2, in order to assign an actual spatial position of the relevant elements with respect to one another to the actually measured values of the flux density, for example an actual starting position of the piston 17 in the brake master cylinder 3 (FIG. 2) in a non-actuated state of the brake master cylinder 1 to a value which is calculated in the process of the magnetic flux density in the magneto-sensitive element 6. This value can then be defined, for example, every time after an ignition operation in a motor vehicle and can be assigned anew to position P1 (see FIG. 5). However, a measure of this type can likewise be dispensed with in defined requirements or tolerance compensation can be carried out in a different way or at a different interval.

FIG. 7

Figure 7:
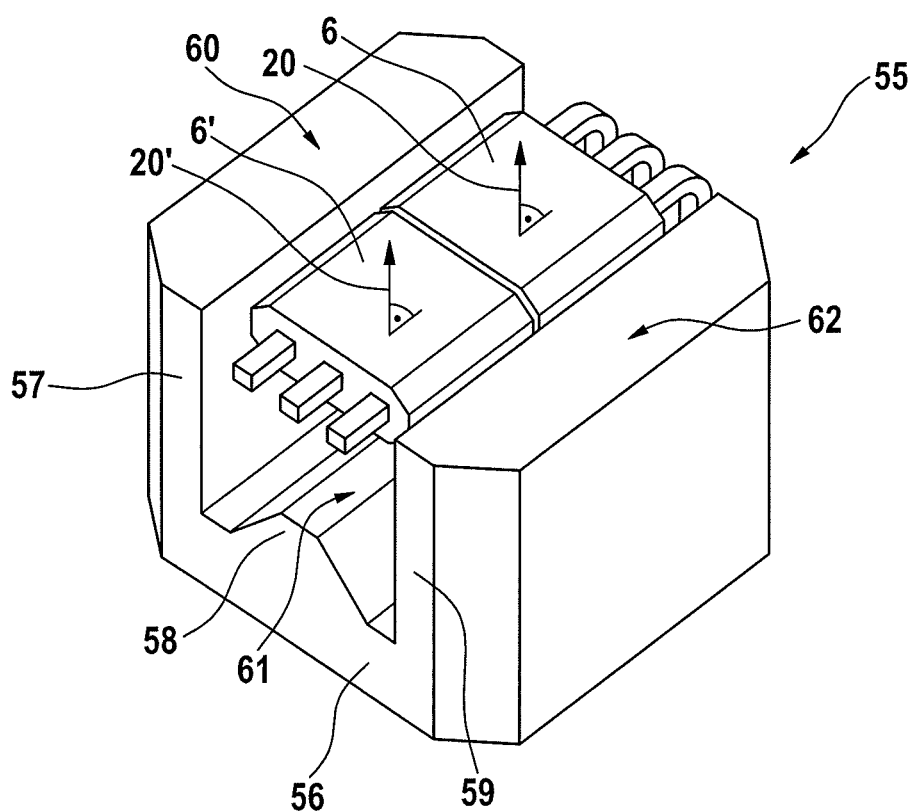
FIG. 7: shows a magnet element with a magneto-sensitive elements arranged therein, in a three-dimensional illustration.

FIG. 7 depicts one embodiment of a magnet element 55 with two magneto-sensitive elements 6, 6' which are arranged therein, in a three-dimensional illustration. The magneto-sensitive elements 6, 6' are positioned next to one another in a spatial section which is delimited by the magnetic pole 60 at the end of the projection 57, the magnetic pole 62 at the end of the equally long projection 59 and the magnetic pole 61 at the end of the shorter projection 58. In the embodiment which is depicted here, the orientation of the normal 20, 20' corresponds to an arrangement which is shown in FIGS. 4c, d. It goes without saying that, in further embodiments, both differently oriented arrangements of the magneto-sensitive elements 6, 6', for example according to FIGS. 4a, b, and also a different number of magneto-sensitive elements within the magnet element 55, for example a single element, are possible within the invention.

The invention claimed is:

1. A brake master cylinder for use within an electronic brake system for motor vehicles, having an apparatus for contactlessly monitoring a position of a piston which can be moved linearly along a piston axis, the apparatus containing:
   a movable element and
   a sensor unit, and the sensor unit being arranged in a stationary manner on a housing of the brake master cylinder and being connected to an electronic evaluation unit for processing signals of the apparatus,
   wherein a magnetic field is emitted by the sensor unit, and
   wherein the movable element is provided as a yoke coupled to the piston for changing the magnetic field in a position-dependent manner in such a way that this change can be detected by the sensor unit.

2. The brake master cylinder as claimed in claim 1, wherein the piston is configured from a non-magnetizable material.

3. The brake master cylinder as claimed in claim 1, wherein the housing is configured from a non-magnetizable material.

4. The brake master cylinder as claimed in claim 1, wherein the yoke is configured from a steel material.

5. The brake master cylinder as claimed in claim 1, wherein a change of the magnetic field in a radial direction (R) can be detected by way of the sensor unit, which radial direction (R) is arranged substantially perpendicularly with respect to a movement axis of the piston.

6. The brake master cylinder as claimed in claim 1, wherein the yoke is arranged in a low pressure region of the brake master cylinder.

7. The brake master cylinder as claimed in claim 1, wherein the piston is configured from a plastic material.

8. The brake master cylinder as claimed in claim 1, wherein the housing is configured from an aluminum material or a plastic material.

9. The brake master cylinder as claimed in claim 1, wherein the yoke is provided such that it is arranged indirectly or directly on the piston).

10. The brake master cylinder as claimed in claim 9, wherein the yoke is supported on the piston or is fixed on the piston.

11. The brake master cylinder as claimed in claim 10, wherein the piston has at least one recess with a groove, for the yoke.

12. The brake master cylinder as claimed in claim 10, wherein the yoke is provided such that it is of annular configuration and/or is inserted into the recess.

13. A brake master cylinder for use within an electronic brake system for motor vehicles, having an apparatus for contactlessly monitoring a position of a piston which can be moved linearly along a piston axis, the apparatus containing:
  a movable element and
  a sensor unit, and the sensor unit being arranged in a stationary manner on a housing of the brake master cylinder and being connected to an electronic evaluation unit for processing signals of the apparatus,
  wherein a magnetic field is emitted by the sensor unit,
  wherein the movable element is provided as a yoke coupled to the piston for changing the magnetic field in a position-dependent manner in such a way that this change can be detected by the sensor unit, and
  wherein the magnetic field is generated by a magnet element, the magnet element being of single-piece design, having a main body, and at least three projections being formed by the main body largely in the direction of the piston axis, and the projections having respective magnetic poles at their ends which face the piston axis.

14. The brake master cylinder as claimed in claim 13, wherein
  at least one projection is configured so as to be shorter than at least two further projections.

15. The brake master cylinder as claimed in claim 13, wherein the sensor unit has at least one magneto-sensitive element.

16. The brake master cylinder as claimed in claim 15, wherein the at least one magneto-sensitive element is arranged in a spatial section between the magnetic poles.

17. The brake master cylinder as claimed in claim 15, wherein the magneto-sensitive element is configured as a Hall element.

18. The brake master cylinder as claimed in claim 15, wherein the magneto-sensitive element is additionally assigned at least one electronic signal processing apparatus which is provided such that it is integrated into the sensor unit.

19. A brake master cylinder for use within an electronic brake system for motor vehicles, having an apparatus for contactlessly monitoring a position of a piston which can be moved linearly along a piston axis, the apparatus containing:
  a movable element and
  a sensor unit, and the sensor unit being arranged in a stationary manner on a housing of the brake master cylinder and being connected to an electronic evaluation unit for processing signals of the apparatus,
  wherein a magnetic field is emitted by the sensor unit, and
  wherein the movable element is provided as a yoke coupled to the piston for changing the magnetic field in a position-dependent manner in such a way that this change can be detected by the sensor unit, and
  wherein the yoke has an outer circumference which is covered by a non-magnetizable material.

20. A method for detecting a piston displacement in a brake master cylinder for use within an electronic brake system for motor vehicles, having an apparatus for contactlessly monitoring a position of a piston which can be moved linearly along a piston axis, the apparatus containing a movable element and a sensor unit, and the sensor unit being arranged in a stationary manner on a housing of the brake master cylinder and being connected to an electronic evaluation unit for processing signals of the apparatus, the method comprising:
  emitting a magnetic field by the sensor unit in the direction of the piston, and the movable element is provided as a yoke coupled to the piston for changing the magnetic field in a position-dependent manner in such a way that the change is detected by the sensor unit, and
  evaluating electrical signals of the sensor unit by the electronic evaluation unit.

21. A method for detecting a piston displacement in a brake master cylinder for use within an electronic brake system for motor vehicles, having an apparatus for contactlessly monitoring a position of a piston which can be moved linearly along a piston axis, the apparatus containing a movable element and a sensor unit, and the sensor unit being arranged in a stationary manner on a housing of the brake master cylinder and being connected to an electronic evaluation unit for processing signals of the apparatus, the method comprising:
  emitting a magnetic field by the sensor unit in the direction of the piston, and the movable element is provided as a yoke coupled to the piston for changing the magnetic field in a position-dependent manner in such a way that the change is detected by the sensor unit, and
  evaluating electrical signals of the sensor unit by the electronic evaluation unit,
  wherein, at least after the brake master cylinder is assembled, a calibrating operation is provided in such a way that an axial spacing between the yoke and the sensor unit is stored in the evaluation unit or in the sensor unit in order to mark a non-actuated starting position of the piston.

22. The method as claimed in claim 21, wherein the calibrating operation is carried out periodically and/or upon each actuation of the brake master cylinder.

23. The method as claimed in claim 21, wherein at least each calibrating operation includes assigning temperature data in such a way that it is made possible to compensate electronically for temperature-induced effects on one or more system components or electrical signals.

* * * * *